(12) United States Patent
Frolov et al.

(10) Patent No.: US 8,448,898 B1
(45) Date of Patent: May 28, 2013

(54) AUTONOMOUS SOLAR AIRCRAFT

(75) Inventors: Sergey V. Frolov, New Providence, NJ (US); Michael Cyrus, Summit, NJ (US); Allan J. Bruce, Scotch Plains, NJ (US)

(73) Assignee: Sunlight Photonics Inc., South Plainfield, NJ (US)

( * ) Notice: Subject to any disclaimer, the term of this patent is extended or adjusted under 35 U.S.C. 154(b) by 0 days.

(21) Appl. No.: 13/460,146

(22) Filed: Apr. 30, 2012

(51) Int. Cl.
*B64D 27/00* (2006.01)

(52) U.S. Cl.
USPC ........................................................... 244/59

(58) Field of Classification Search
USPC .................... 244/59, 45 R, 13, 15, 16, 51, 52, 244/124
See application file for complete search history.

(56) References Cited

U.S. PATENT DOCUMENTS

| | | | | |
|---|---|---|---|---|
| 4,415,133 | A | * | 11/1983 | Phillips ........................ 244/53 R |
| 5,810,284 | A | * | 9/1998 | Hibbs et al. ..................... 244/13 |
| 6,550,717 | B1 | * | 4/2003 | MacCready et al. ............ 244/13 |
| 6,581,873 | B2 | * | 6/2003 | McDermott ..................... 244/25 |
| 6,742,741 | B1 | * | 6/2004 | Rivoli ........................... 244/12.1 |
| 6,931,247 | B2 | * | 8/2005 | Cox et al. ..................... 455/431 |
| 6,944,450 | B2 | * | 9/2005 | Cox .............................. 455/431 |
| 7,093,789 | B2 | * | 8/2006 | Barocela et al. ................ 244/30 |
| 7,137,592 | B2 | * | 11/2006 | Barocela et al. ................ 244/29 |
| 7,198,225 | B2 | * | 4/2007 | Lisoski et al. .................. 244/55 |
| 7,281,681 | B2 | * | 10/2007 | MacCready et al. ............ 244/59 |
| 7,530,527 | B2 | * | 5/2009 | Kelleher ........................... 244/2 |
| 7,762,495 | B2 | * | 7/2010 | Miller ............................. 244/13 |
| 7,802,756 | B2 | * | 9/2010 | Kendall et al. .............. 244/45 R |
| 7,923,282 | B2 | | 4/2011 | Frolov et al. |
| 8,002,216 | B2 | * | 8/2011 | Decker ........................... 244/58 |
| 8,011,616 | B2 | * | 9/2011 | MacCready et al. ............ 244/59 |
| 8,028,951 | B2 | * | 10/2011 | MacCready et al. ............ 244/59 |
| 8,128,031 | B2 | * | 3/2012 | Boertlein ................... 244/123.1 |
| 2003/0141409 | A1 | * | 7/2003 | Lisoski et al. .................. 244/13 |
| 2005/0258306 | A1 | * | 11/2005 | Barocela et al. ................ 244/30 |
| 2006/0292957 | A1 | * | 12/2006 | Howard .......................... 446/61 |
| 2008/0203219 | A1 | * | 8/2008 | MacCready et al. ............ 244/59 |
| 2008/0237404 | A1 | * | 10/2008 | MacCready et al. ........ 244/53 R |
| 2010/0001122 | A1 | * | 1/2010 | Boertlein ........................ 244/16 |

* cited by examiner

*Primary Examiner* — Philip J Bonzell
(74) *Attorney, Agent, or Firm* — Moser Taboada; Alan Taboada

(57) ABSTRACT

Methods and apparatus for unmanned long endurance flights are provided herein. In some embodiments, a lightweight solar wing for unmanned aircraft may include at least one airfoil profile, a top surface, a bottom surface, a leading edge, a trailing edge, wing tips, and at least one photovoltaic cell, wherein the surfaces and edges follow an arched bow shape across a span of the wing. In some embodiments, an unmanned solar-powered aircraft may include at least one lightweight solar wing as described above, at least one fuselage, and at least one propeller, wherein the fuselage is placed below the solar wing and contains an electric motor, battery, and electronics.

28 Claims, 9 Drawing Sheets

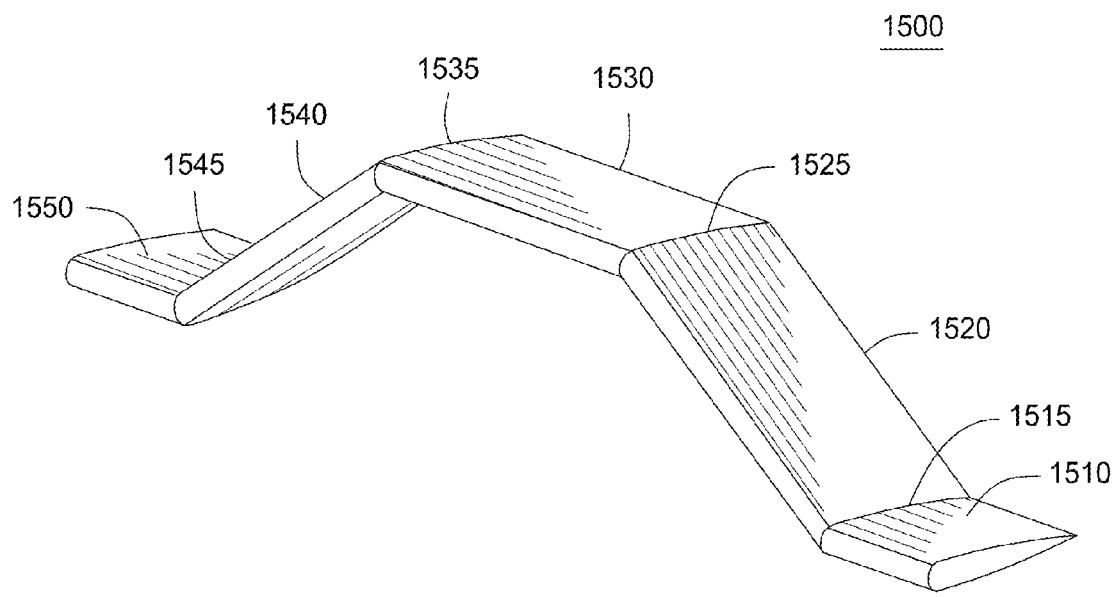
FIG. 15
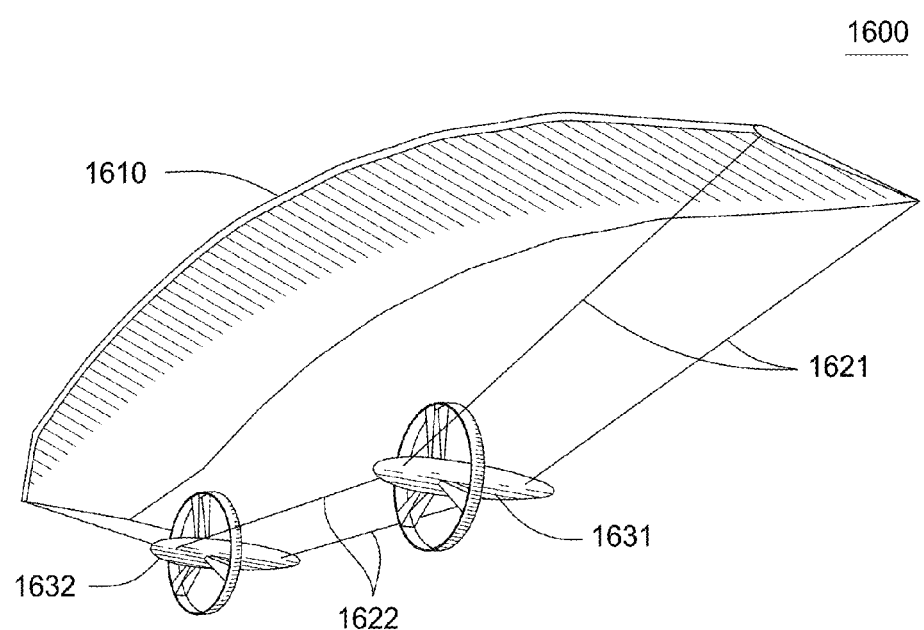

AUTONOMOUS SOLAR AIRCRAFT

FIELD

The present invention relates generally to methods and apparatus for autonomous solar-powered flight, in particular long-endurance solar-powered flight.

RELATED ART

Unmanned Aerial Vehicles (UAVs) are unpiloted aircraft that are either controlled remotely or flown autonomously along pre-programmed flight plans. UAVs are commonly categorized based on their design and performance specifications spanning the range from miniature low altitude aircraft through large High Altitude Long Endurance (HALE) vehicles. HALE UAVs in particular could provide improvements over existing systems in a large number of military and civil applications, ranging from border patrol, coastal surveillance, monitoring of natural disasters, meteorology and cartography, to highly flexible telecommunication relay stations. For example, platforms capable to remain airborne for long times at altitudes of about 10-25 km provide advantages over satellite systems in terms of reduced costs, increased flexibility, and higher precision.

Design, manufacturing, and operation of HALE UAVs pose many challenges and require innovative solutions in aircraft configuration, its propulsion system, and its power train. In order to enable flight endurance on the order of weeks, months, or years, the propulsion system needs to be able to provide thrust for the flight continuously day and night, which leads to heavy fuel load when using a non-regenerative system. However, in a regenerative system that can harvest renewable energy such as sunlight, the power train needs to be doubled: one system for the daytime and the second one for the night. Because of this redundancy, a low propulsive power is a key driver in the design, entailing the need for low UAV weight and flight speed.

The inventors believe that UAV technology is taking an increasingly important place in our society for civilian and military applications. The required endurance is in the range of a few hours in the case of law enforcement, border surveillance, forest fire fighting or power line inspection. However, other applications at high altitudes, such as communication platform for mobile devices, weather research and forecast, environmental monitoring, surveillance, and various military missions would require the ability to remain airborne for days, weeks, months, or even years. The inventors believe that it is possible to reach these goals using electric sunlight-powered platforms. Photovoltaic (PV) cells and modules may be used to collect the solar energy during the day, a part of which may be used directly to for maintaining flight and onboard operations with the remainder being stored for the night time.

SUMMARY

Methods and apparatus for unmanned long endurance flights are provided herein. In some embodiments, a lightweight solar wing for unmanned aircraft may include at least one airfoil profile, a top surface, a bottom surface, a leading edge, a trailing edge, wing tips, and at least one photovoltaic cell, wherein the surfaces and edges follow an arched bow shape across a span of the wing.

In some embodiments, an unmanned solar-powered aircraft may include at least one lightweight solar wing as described above, at least one fuselage, and at least one propeller, wherein the fuselage is placed below the solar wing and contains an electric motor, battery, and electronics.

In some embodiments, a method of constructing a long endurance unmanned solar aircraft may include providing a solar wing having a downward bow shape and at least one photovoltaic cell; providing a fuselage containing an electric motor, battery, power electronics, flight controls, communications, and payload; and placing and attaching the fuselage below the solar wing using one or more of direct attachment or attachment via an additional strut.

Other and further embodiments are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

FIGS. 12-15 show exemplary embodiments of solar wings in accordance with some embodiments of the present invention.

FIG. 16 depicts a solar-powered aircraft for unmanned long endurance flight in accordance with some embodiments of the present invention.

Figure 1:
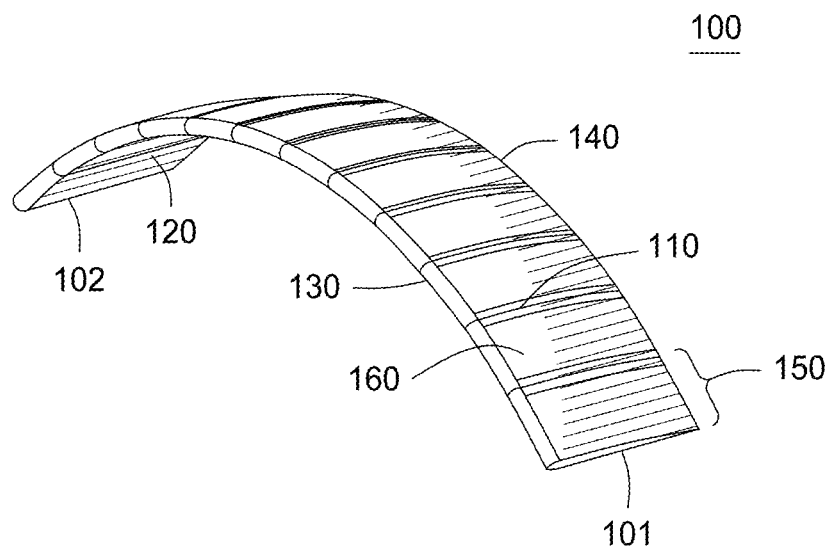
FIG. 1 depicts an apparatus for unmanned long endurance flight in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

In the following detailed description, numerous specific details are set forth in order to provide a thorough understanding of exemplary embodiments or other examples described herein. However, it will be understood that these embodiments and examples may be practiced without the specific details. In other instances, well-known methods, procedures, components, and/or circuits have not been described in detail, so as not to obscure the following description. Further, the embodiments disclosed are for exemplary purposes only and other embodiments may be employed in lieu of, or in combination with, the embodiments disclosed.

In some embodiments of the present invention, an apparatus such as a wing is provided for unmanned long endurance flights, as shown in FIG. 1. In this case, a solar wing 100 is comprised of at least its wing tips 101 and 102, top surface 110, bottom surface 120, leading edge 130, and trailing edge 140. The span of the wing is measured by the distance between its tips. The wing 100 may be straight or bent forming a bow as shown in FIG. 1. The negative, i.e., downward, curvature of the wing 100 shown in FIG. 1 may be beneficial when placing photovoltaic (PV) solar cells on its top surface 110, since it prevents cross-shading from different parts of the wing or an airframe in general including all other parts of an aircraft. In general the height of the leading edge is much larger than that of the trailing edge. The airfoil profile, i.e., the cross-section of the wing, may be constant or varying across the span. When varying, the airfoil profile may vary either monotonically or non-monotonically. For example, it may be preferable to have a thicker (e.g., top to bottom) and wider (e.g., leading edge to trailing edge) profile in the central portion of the wing and a thinner narrower profile in the portion closer to the wing tips. The wing 100 may be also composed of several distinct sections 150. Sections 150 may be for example straight sections, i.e., where the leading edge may follow a straight line, and may be attached to each other at an angle such that together the sections 150 form the wing 100. FIG. 1 shows 12 such identical sections 150, which form a smoothly varying bow wing shape. Of course, non-identical sections 150 may also be used. The top surface of each section 150 may incorporate PV cells or modules 160. In this case, at least some and preferably all wing surfaces, including the top surface 110, are surfaces where the Gaussian curvature at any surface point is equal to zero, so that they may be produced from a planar flat surface by bending without stretching or compressing (examples of such surfaces include planar, cylindrical, and conical surfaces). This greatly simplifies the attachment and incorporation of PV cells onto these surfaces, which may be bent, but typically cannot be stretched. PV cells 160 may cover the wing surface completely or partially, the latter case shown in FIG. 1.

The wing 100 may be manufactured using a range of various lightweight materials and designs, including but not limited to plastics, metal foils, carbon fibers, foams, fabrics, composite materials, etc. The solar wing may be produced using a hybrid approach, where a number of different materials are advantageously combined to produce a single lightweight wing. Generally, lightweight materials are those materials that can provide a relatively large wing area at a low wing weight, where the wing area is measured from the wing projection onto a horizontal plane at zero angle of attack. In other words, lightweight materials can achieve a low wing loading, where the wing loading is defined as the ratio of the wing weight to its area. For example, wings with loadings of less than about 2.5-5 kg/m$^2$ and preferably less than about 1-2 kg/m$^2$ may be considered lightweight. In order to achieve or improve lightweight characteristics, the wing may be made for example hollow or thin. For instance, a solar wing or some of its sections may be produced from a thin planar sheet (e.g., an expanded polypropylene foam sheet) by bending it to form a specific airfoil profile. The cross-section of the wing or its profile may correspond to specific airfoil profiles. Some airfoil profiles are more aerodynamically efficient than other profiles and thus may achieve larger lift coefficients while maintaining lower drag coefficients. It is preferable to use airfoil designs that are specifically optimized for better endurance and larger lift, especially at low Reynolds numbers of less than 300,000. For example, Liebeck airfoils, which are typically characterized by large lift coefficients, may be used advantageously for producing a lightweight solar wing.

The solar wing may include other aerodynamic elements that may increase or otherwise modify the lift and drag coefficients of the solar wing. These additional wing elements may be fixed or movable. Movable elements for example may include slats and flaps that can arbitrarily change the position of the leading and trailing edges, respectively, and thus either increase or decrease the lift coefficient of the wing. Flaps may also be used to control the flight of an aircraft and change pitch, roll and yaw angles. Additional features may include fixed wing openings to increase lift coefficient, vortex generators and others. In particular, the fixed wing openings may extend the substantial part of the wing, thus essentially sectioning the wing into multiple wings. Their use may significantly increase the lift coefficient, even beyond the theoretical limit of about 3 that is achievable with a single solid wing.

Figure 10:
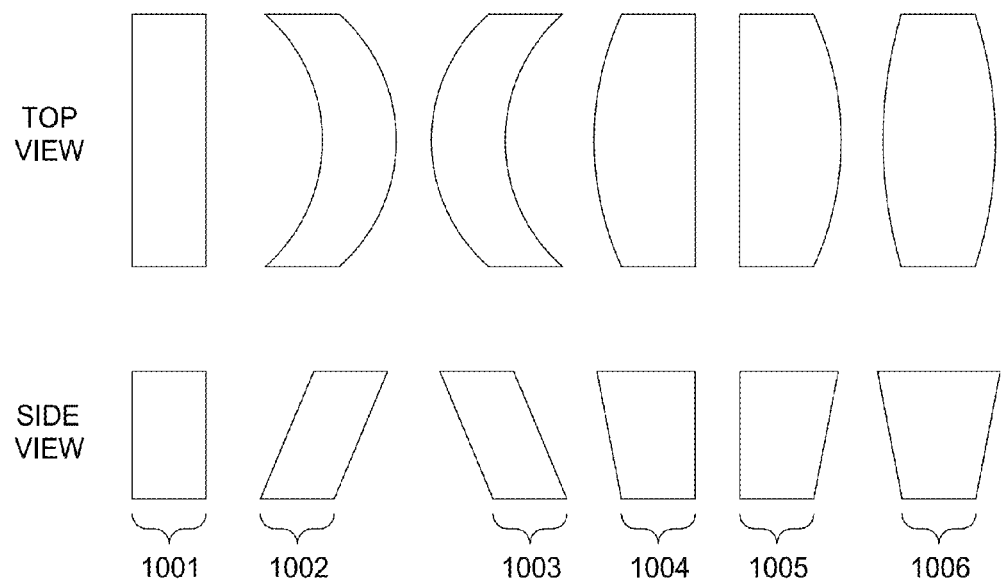
FIG. 10 depicts top and side views of examples of bowed solar wing shapes that may be suitable for HALE UAV applications in accordance with some embodiments of the present invention.

Solar wings may have various shapes that are different from the shape shown in FIG. 1. For example, FIG. 10 shows a number of different examples of bowed solar wing shapes that may be suitable for HALE UAV applications: 1001—straight rectangular wing, 1002—forward swept wing, 1003—backward swept wing, 1004—round leading edge wing, 1005—round trailing edge wing, and 1006—round leading and trailing edges wing. Of course other shapes and their variations may be used, including various configurations in the design of wing profile across the wing span, arch shapes of the wing bow, wing tips, and leading and trailing edges.

Figure 2:
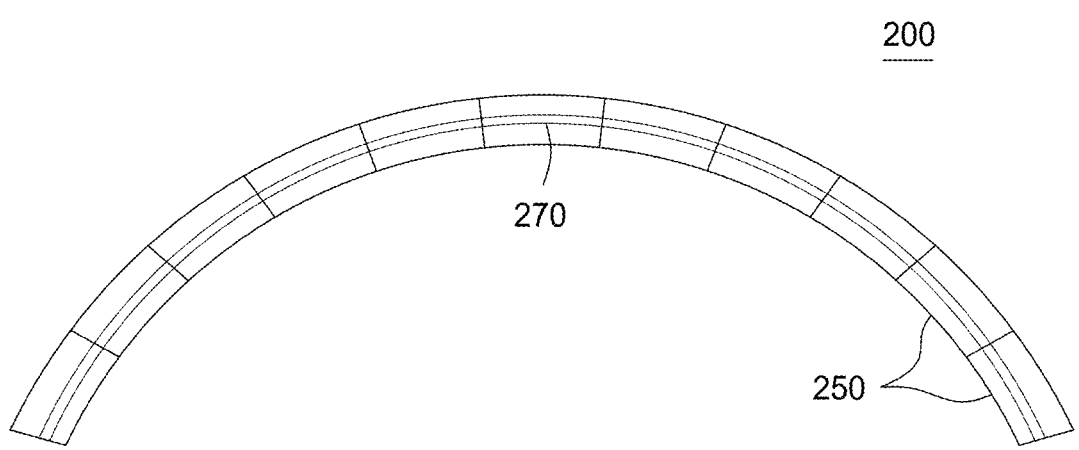
FIG. 2 shows a front view cross-section of a solar wing in accordance with some embodiments of the present invention.

At least some parts of the wing 100 may be non-load bearing structures and consequently may be flexible, bendable, stretchable, collapsible, etc. The wing 100 may comprise additional structural elements that allow it to hold its shape and prevent excessive flexing, bending, stretching, collapsing etc. For example, FIG. 2 shows a front view cross-section of a solar wing 200, composed of several sections 250 attached to each other and forming a continuously arched, or bow shaped wing. Sections 250 may be straight or curved. At least a portion of each or some sections 250 and particularly such surfaces that incorporate PV cells may be fixed, rigid or non-stretchable, in order to prevent any structural damage and degradation to the PV cells that can be potentially caused by excessive mechanical movements of these cells. These sections are also attached to at least one additional structural member 270 that is used to hold the sections in place and maintain the general shape of the wing. The structural member 270 may be rigid or flexible, relaxed or tensed, solid or hollow, depending on the overall airframe design. For example, it can be a lightweight, plastic pipe (or several of them) formed or bent to follow a predetermined shape of the wing 200. Structural member or members may also follow and maintain complex shapes, including three-dimensional wing shapes and profiles. For example, a lightweight semi-rigid wing skeleton may be built using carbon-fiber enhanced polymers, and its skin may be made from durable plastics, such as polyester, ethylene tetrafluoroethylene (ETFE), polyvinylidene difluoride (PVDF) and others, that are able to function for extended periods of time (from weeks to years) without significant deterioration of their physical properties. In addition, some polymers and synthetic fabrics that are known to be susceptible to UV light may be also used when their durability can be enhanced by overlaying them with UV-protective coatings. The attachment between different sections 250 may be hinged or otherwise flexible to allow relative movement between these sections without stretching or stressing the surfaces with integrated PV cells. In addition to or instead of passive means of maintaining the wing shape, such as supplementary structure-strengthening elements, active means of maintaining the wing shape may be used. For example, the leading edge or the bottom surface of the wing may have an opening to provide an entry for surrounding air inside the wing and achieve a positive outward pressure against wing surfaces. An alternative way of achieving excess air pressure inside the wing in order to help it maintain its shape may be by using an air pump. In this case the wing surfaces may be completely closed minimizing parasitic drag, while the pump may be placed inside the wing or other parts of the airframe described below.

Figure 11:
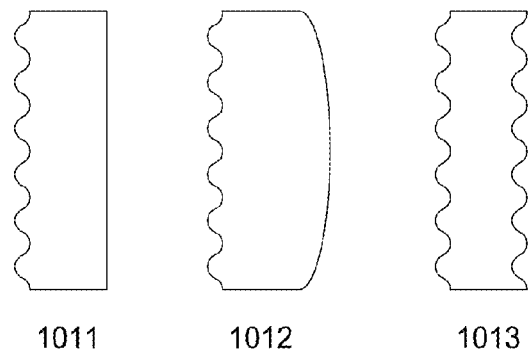
FIG. 11 depicts top views of exemplary solar wings with non-monotonic and periodic variations that result in modifications of shapes in either leading edge, trailing edge or both edges of a wing of an aircraft in accordance with some embodiments of the present invention.

The arch or the bow of a bowed wing (i.e. a bow wing) may follow circular, elliptical, polygonal, and other more complex bow-shaped lines. For example, a bow wing may be constructed from a single elliptically curved section. Alternatively, a bow wing may be constructed from several joined straight sections as shown below. Also, the solar wing shape may be twisted, so that the wing profile may vary its angle with respect to the horizontal axis across the wing span. In addition, the shape of the wing may have various non-monotonic variations in its airfoil profiles, including variations in the airfoil chord, thickness, chamber, and other parameters. For example, FIG. 11 shows illustrative examples of such non-monotonic and periodic variations that result in modifications of shapes in either leading edge, trailing edge, or both edges: 1011—knobbed leading/straight trailing edge wing, 1012—knobbed leading/round trailing edge wing, 1013—knobbed leading/trailing edge wing. These monotonic and non-monotonic wing shape variations may improve aerodynamic characteristics of a solar wing and make it even more suitable for HALE UAV applications. Such improvements include increase in the aerodynamic lift coefficient, aerodynamic efficiency, flight endurance, stall angle, flight stability, ease of flight control, safety, and others.

Figure 12:
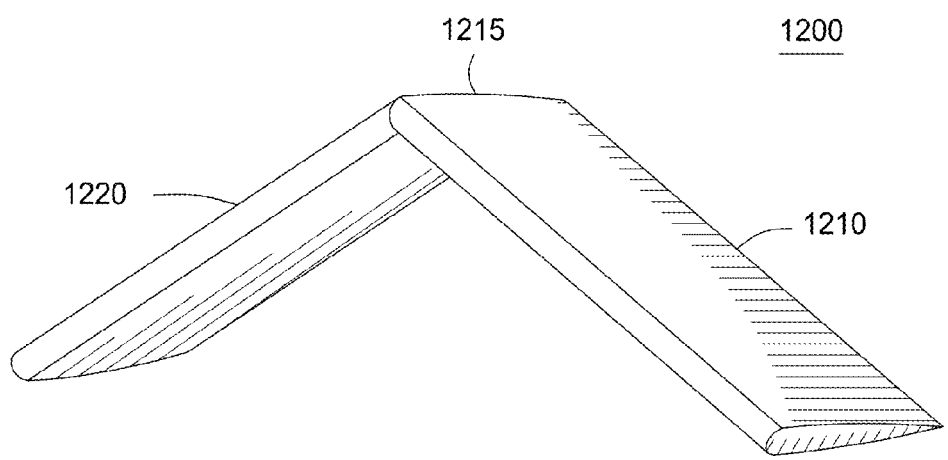
Figure 13:
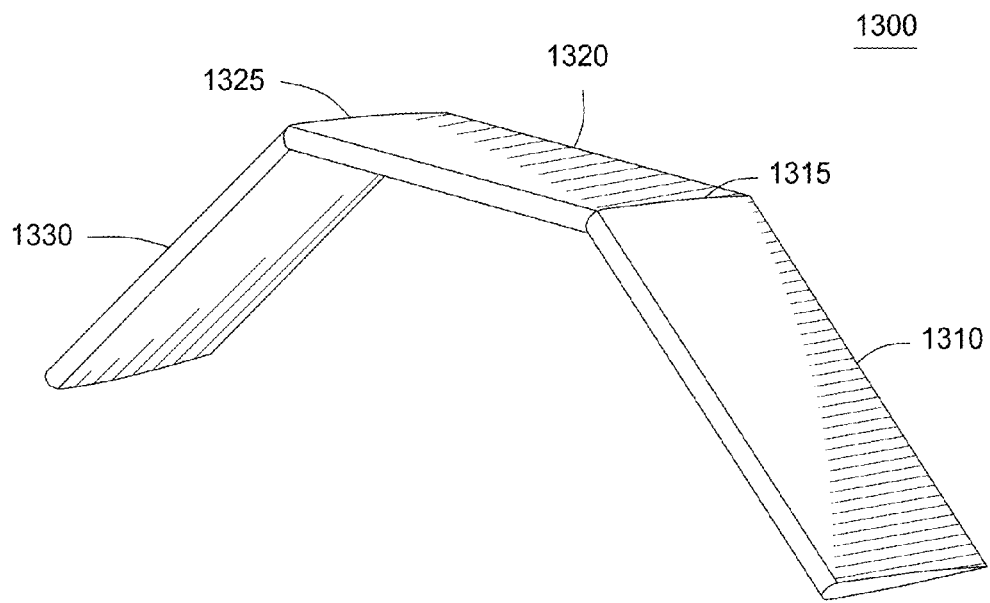
Figure 14:
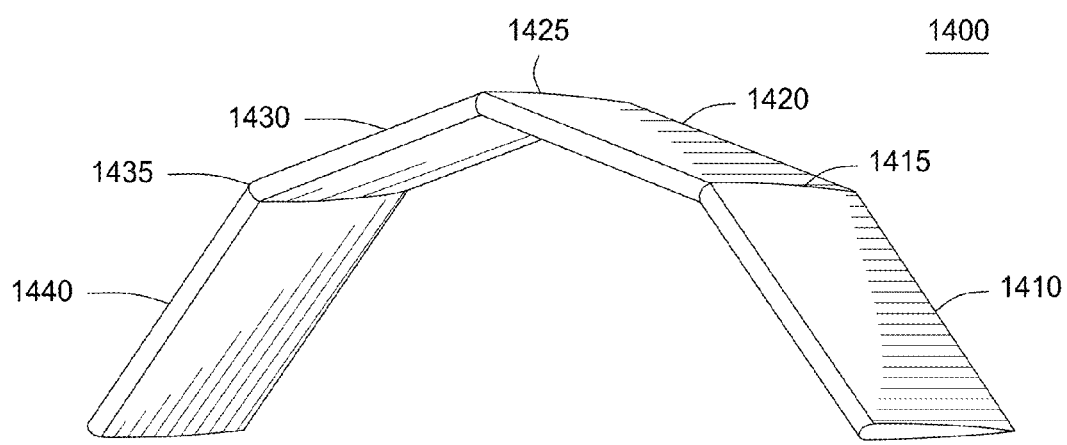

FIGS. 12-15 show exemplary embodiments of solar wings comprised of several straight wing sections. These examples are of course the basic starting designs for an arched or bowed wing and more elaborate and complex wing shapes can be produced that are based on them. FIG. 12 shows a wing 1200 comprising wing sections 1210 and 1220 that are connected via a joint 1225. By varying an angle between the sections 1210 and 1220 at the joint 1215, the wing 1200 can take various triangular arch shapes (that are also variants of bow shapes). This angle can be either fixed or changeable in flight, so that the 180 degree angle produces a straight wing and angles larger than 180 degrees produce inverted arch shapes with upward sloping wing sections. FIG. 13 shows a wing 1300 comprising three wing sections 1310, 1320, and 1330 that are connected via joints 1315 and 1325. Flexible joints 1315 and 1325 may produce arbitrary angles between sections 1310, 1320, and 1330, resulting in various trapezoidal bow wing shapes. Generally, a symmetric wing design is preferred where the central wing section is horizontal. FIG. 14 shows a wing 1400 comprising four wing sections 1410, 1420, 1430, and 1440 that are connected via joints 1415, 1425, and 1435. Flexible joints 1415, 1425, and 1435 may also produce arbitrary angles between different wing sections and may remain constant or variable. The variability of the angle between wing sections may be useful for storing and transportation of the wing, and also for added functionality during flight as shown below. Finally, FIG. 15 shows a wing 1500 comprising five wing sections 1510, 1520, 1530, 1540, and 1550 that are connected via joints 1515, 1525, 1535, and 1545. In this example, the angles between wing sections may be either less than 180 degrees (downward) or greater than 180 degrees (upward) at the same time, so that the end wing sections 1510 and 1550 may be horizontal (or even upward tilting).

Figure 17:
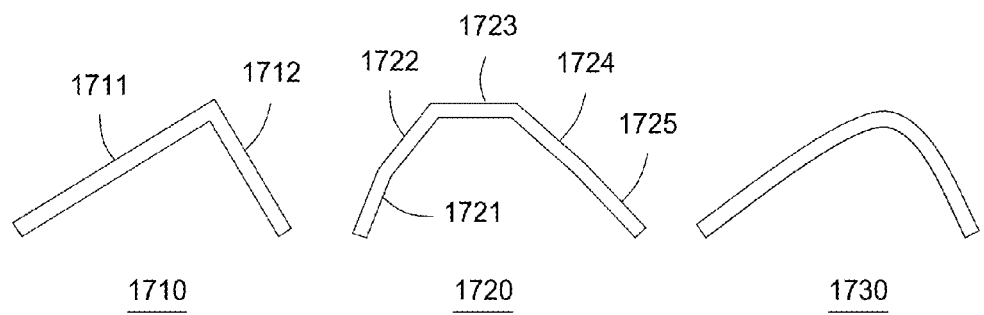
FIG. 17 shows various front views of exemplary embodiments of asymmetrically shaped solar wings in accordance with some embodiments of the present invention.
Figure 18:
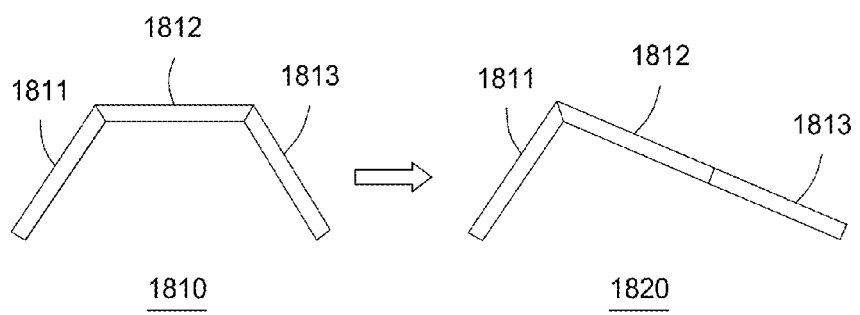
FIG. 18 shows various front views of a solar wing with capability to change shapes between the symmetric and asymmetric shapes in accordance with some embodiments of the present invention.

The solar wings described above may have either a symmetric or asymmetric shape. In the former case a wing may have a plane of symmetry, such as reflection symmetry, for example a vertical plane passing through the center of a wing (as shown in FIGS. 1,2). A symmetric wing may have other symmetry planes, axes and corresponding symmetry transformations. Alternatively, a wing may lack any specific symmetry; the examples of asymmetric wings are given in FIG. 17 (only their front views are shown). In these cases, the wing 1710 may consist of two unequal straight sections 1711 and 1712 angled with respect to each other. On the other hand, the wing 1720 may comprise five equal straight sections 1721, 1722, 1723, 1724 and 1725 that are tilted at different angles with respect to each other. The wing 1730 may have a smooth asymmetric shape as shown in FIG. 17, which may be built from either a single section or multiple curved sections. In addition, FIG. 18 shows a solar wing that can change its shape from the symmetric form 1810 to the asymmetric form 1820. The wing in this case is comprised of three straight sections 1811, 1812 and 1813, so that the wing shape can be varied by changing the angles between sections. Asymmetric solar wings in general may have advantages in solar energy collection versus symmetric solar wings by being able to tilt more of their surfaces towards the sun and thus achieve a higher energy yield.

Of course other wing shapes may be constructed based on these principles, for example by increasing the number of wing sections, varying angles between sections and also changing the size and shape of individual sections (e.g. using curved sections).

Figure 3:
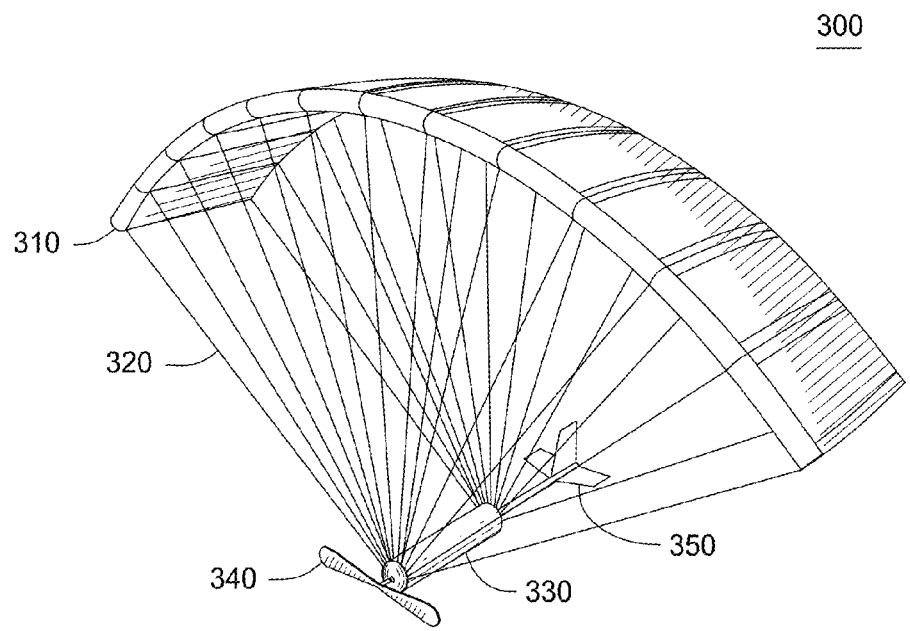
FIG. 3 depicts a solar-powered UAV apparatus for unmanned long endurance flight in accordance with some embodiments of the present invention.
Figure 4A:
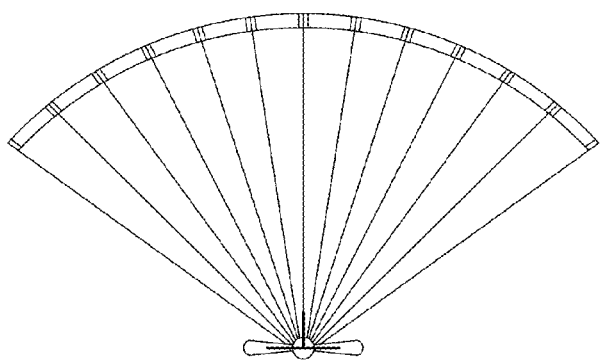
FIG. 4 depicts back (4a) and side (4b) views of the apparatus of FIG. 3.
Figure 4B:
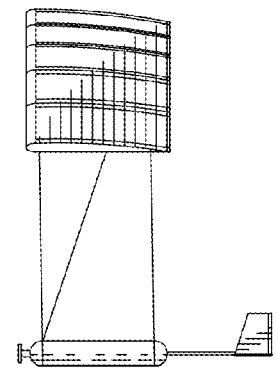

In accordance with embodiments of the present invention, a solar-powered UAV apparatus, a solar aircraft 300, is provided that is useful for unmanned long endurance flight, as shown in FIG. 3. In addition, FIG. 4 shows the back (a) and side (b) views of the same apparatus. The solar aircraft 300 comprises solar wing 310, struts 320, fuselage (or a pod) 330, propeller 340, and tail 350. Solar wing 310 may be similar to the wing 100 in FIG. 1 with its top surface covered with PV cells. The fuselage 330 is held by several lightweight struts 320, which may be rigid or flexible. For example, these struts may be made from either wires, pipes, bands, lines, ropes or cords. The fuselage 330 is used to house and contain all the primary elements of the power system, electrical motor, flight control electronics, communications, payloads, etc. The power system or the power train of the aircraft includes electrical power storage, such as batteries and regenerative fuel cells, which may represent a substantial portion of the aircraft weight. As a result, most of the aircraft 300 weight is primarily in the weight of the fuselage 330, so that the wing 310 may be very thin or hollow and thus very lightweight. The fuselage shape is aerodynamic and elongated, in order to minimize the air resistance and parasitic drag. The propeller 340, as an element of the aircraft propulsion system, provides means for the forward thrust needed for staying airborne. The propeller may be positioned in front of the aircraft as a pulling propeller (as is the case in FIG. 3), or it may be positioned behind the aircraft as a pushing propeller. Alternatively, it may be positioned in the middle of a fuselage. In either case, the propeller is positioned substantially far from the wing 310 (at a distance greater than the wing's chord below the wing) to avoid interfering with the air flow over the wing and thus changing its aerodynamic characteristics. This solar UAV design is in sharp contrast with the existing solar UAV designs, in which the power train and propulsion system is integrated into or co-located with the wing (as for example in Zephyr UAV from Qinetiq or NASA's Helios). The propeller shape and size may be configured specifically for a low speed, high altitude flight typical in HALE UAV applications. An optional tail section 350 provides a mechanism for the flight control and helps the aircraft to turn and change altitude. However, the solar UAV 300 may also be able to turn and change altitude without the tail 350 by using alternative flight control mechanisms, e.g. by varying the shape of the wing 310 or shifting the fuselage position underneath the wing. The tail section, i.e. an empennage, may include a fixed horizontal stabilizer with a movable elevator and a vertical stabilizer with a rudder, which can be used as flight control surfaces as in a typical airplane. Of course, other empennage configurations different from the one shown in FIG. 3 may be used in solar UAVs.

The aircraft 300 is particularly useful for long endurance unpiloted flights for at least two reasons. It provides a large surface area for placing solar cells on its wing top surface, which provides largely unobstructed exposure to sunlight. In the case of a curved bow wing, the PV solar cells may be oriented at different angles and thus exposed to sufficient amount of sunlight throughout the day from sunrise to sunset. Thus, there may not be any need for additional surfaces for PV cells in either horizontal or vertical planes. In addition, since the wing 310 may be a non load-bearing structure, it can be made extremely lightweight (e.g., having wing loading of less than about 0.5-1 kg/m$^2$). The proper wing shape can be maintained during flight by the combined forces from the airflow, struts 320, and other optional structural elements if needed (e.g., the wing member 270 in FIG. 2). In its simplest form, the wing 310 may be hollow and made entirely from light-weight fabric without any rigid structure, so that its shape is maintained by combined forces from (1) suspension struts 320, (2) compressed air inside the wing that enters through vents in the leading edge and/or bottom surface of the wing, and (3) the air flowing outside the wing. The wing 310 in this case may be similar to a paraglider wing, however this similarity is superficial. A regular parachute or paraglider canopy is not suitable as a mounting surface for solar cells, as it is too flexible and fragile. The surfaces of a solar wing containing solar cells have to be sturdy enough to maintain their weight and integrity. Thus, a paraglider wing and its design cannot be directly applied to the design of a solar wing suitable for UAV applications. The solar wing 310 does not have to be collapsible and compact as parachute canopies in regular paraglider wings and instead may be at least in part rigid. At least some or all of the elements in the construction of the wing 310 may be made from lightweight rigid materials, e.g., plastic films, carbon fiber, composite materials and others. In addition, solid surfaces (e.g., the top surface of a foam sheet) may be provided to reliably attach and secure PV cells to; these surfaces may be only able to flex within safe bending limits of a PV cell without breaking due to its contraction or expansion, Furthermore, paraglider wings and canopies are made primarily from open cells, allowing air to pass and inflate the canopy, which severely degrades aerodynamics of wing and may make it unsuitable for UAV applications. The solar wing in contrast does not have to have open cells and instead may use only fixed, rigid, or semi-rigid sections to maintain its profile and superior aerodynamic characteristics. Also, paraglider wings are made from polyester or nylon fabrics, which are nondurable and susceptible to degradation of their mechanical properties due to exposure to sunlight and adverse weather conditions with typical operational lifetimes of 300 hours or less. On the contrary, the solar wings have to be highly durable and operable for several months or even years.

Figure 5:
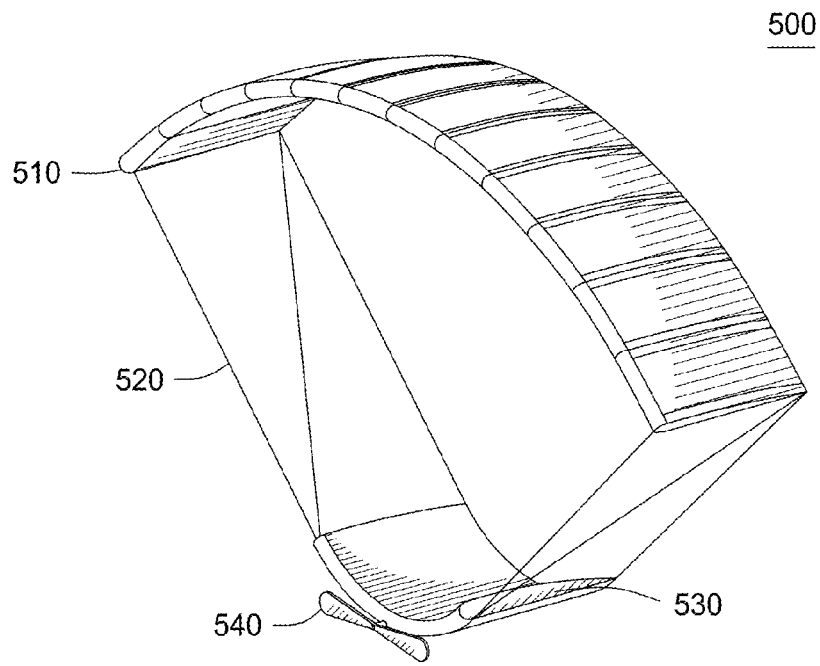
FIG. 5 depicts a solar-powered aircraft for unmanned long endurance flight in accordance with some embodiments of the present invention.

In accordance with some embodiments of the present invention, another solar-powered aircraft 500 is provided that is optimized for unmanned long endurance flights, as shown in FIG. 5. The solar aircraft 500 comprises main wing 510, suspension lines or struts 520, secondary wing 530, and propeller 540. Main wing 510 may be similar to the wing 100 in FIG. 1 with its top surface covered with PV cells. The secondary wing 530 is held by several lightweight struts 520, which may be rigid or flexible. For example, these struts may be made from either wires, pipes, bands, lines, ropes, cords, or the like. The secondary wing 530 is similar in its functionality to the fuselage 330 of the aircraft 300 in that it is used to house all the primary elements of the aircraft power system, its electrical motor, flight control electronics, communications, payloads, etc. In addition, the secondary wing 530 can provide additional aerodynamic lift due to its airfoil shape and thus reduce the wing loading on the main wing 510. Since the aircraft 500 has two different independent wings, it can be considered a bi-plane. However, the lift of the secondary wing alone is insufficient to make it airborne, so that the struts 520 may be under tensile stress (where the wing 510 pulls up and wing 530 pulls down). The secondary wing shape may be straight, bent or curved as shown in FIG. 5. Also as an option, the secondary wing 530 may be also covered with PV cells.

In accordance with some embodiments of the present invention, another solar-powered aircraft 1600 is provided that is suitable for unmanned long endurance flights, as shown in FIG. 16. The solar aircraft 1600 comprises solar wing 1610, struts 1621 and 1622, and fuselages 1631 and 1632. Solar wing 610 may be similar to the wing 100 in FIG. 1 with its top surface covered with PV cells. The struts 1621 and 1622 may be either the same or different; they may be either flexible, like for example wires and cords, or rigid, like for example rods or tubes. The fuselages 1631 and 1632 contain electrical motors, protective cages for propellers, power train components, and other electronic parts of the aircraft. The propellers in this case, instead of protruding from the fuselage, are fitted onto the fuselage. The two motors may be controlled independently from two different electronic speed controllers (ESC) to provide efficient yaw angle control.

Figure 6:
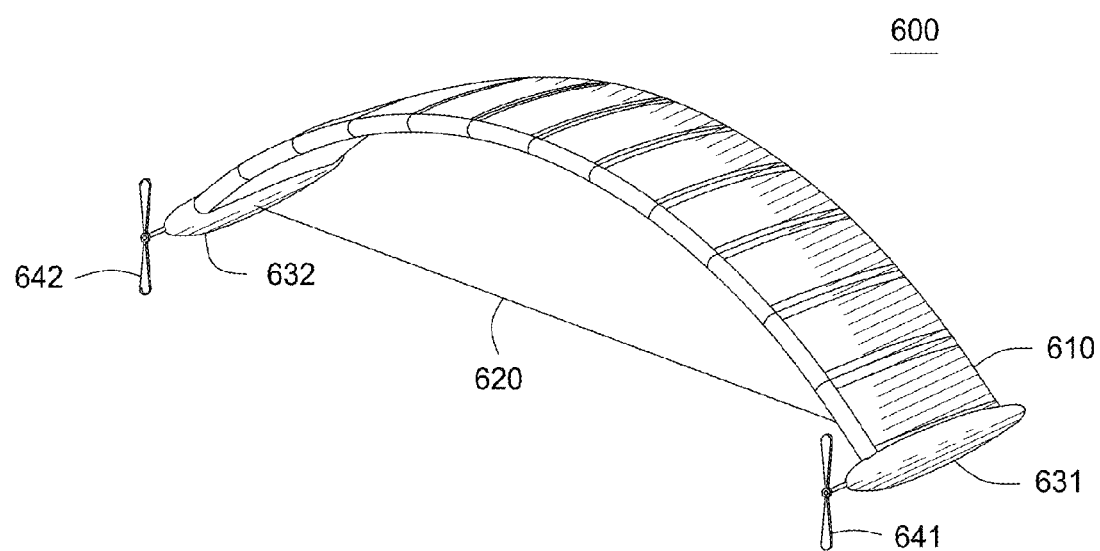
FIG. 6 depicts a solar-powered aircraft for unmanned long endurance flight in accordance with some embodiments of the present invention.

In accordance with some embodiments of the present invention, another solar-powered aircraft 600 is provided that is attractive for unmanned long endurance flights, as shown in FIG. 6. The solar aircraft 600 comprises solar wing 610, struts 620, fuselages 631 and 632, and propellers 641 and 642. Solar wing 610 may be similar to the wing 100 in FIG. 1 with its top surface covered with PV cells. The wing 610 is held bent as a bow by at least one lightweight strut 620, which may be rigid or flexible. For example, this strut may be made from either wires, tubes, pipes, bands, lines, ropes, cords, or the like. The strut 620 may be aerodynamically shaped or surrounded by an aerodynamic envelope to reduce parasitic drag. The strut 620 may also be shaped as a secondary wing to provide additional lift. The strut 620 may be under tensile stress, whereas some parts of the wing 610 may be under compressive stress. The curvature of the wing 610 and induced tension provide structural rigidity to the overall airframe of the aircraft 600. Fuselages 631 and 632 may be attached directly to the opposite tips of the wing 610, respectively. Alternatively, one or more fuselages may be hung on the wing by the struts in a way similar to those in the aircraft shown in FIGS. 3-5. These fuselages may be used to house the power train, flight controls, electronics, engines, payloads and other components of a complete airborne system. In this case two propellers 641 and 642 instead of one may be used for propulsion, which increases system reliability, safety, and flexibility. The multiple engine aircraft (with two electrical engines and propellers in this case) also may have additional maneuverability, where a differential thrust between different engines may be used for aircraft turning and other flight maneuvers. Other configurations with the number of engines greater than two are also possible. Additional elements may be included in the aircraft 600, such as tail sections and wing flaps for maneuvering, pneumatic systems for flight controls, fuel cells for extra energy storage, alternative energy scavenging devices, landing gear, navigation lights, etc. For example, an empennage or a parts thereof (e.g., a vertical stabilizer) may be attached to each fuselage in the aircraft 600.

The solar aircrafts described above have several common features, including a large main lightweight solar wing preferably with a downward bow and the center of gravity that is located substantially below the wing. The main weight of an aircraft that comes primarily from the power train and propulsion system is contained inside a pod or multiple fuselages below the main wing. Thus, the centers of gravity for the airframes shown in FIGS. 3, 5, and 6 are positioned below the lowest point of their respective main wings. This feature increases the stability of a solar aircraft, particularly around its pitch and roll axes, and greatly simplifies its flight control. Also, the solar wing is characterized by at least two reference points: (1) a center of pressure, which is the point where resulting aerodynamic forces are applied, and (2) a neutral point, which is the reference point for which the pitching moment does not depend on the angle of attack. For example, in a typical airfoil the neutral point can be 25% of cord length away from the leading edge. The fuselage(s) may be positioned with respect to the wing so that the center of gravity is in front of the neutral point of the wing. The center of gravity may also be below the neutral point of the wing, as discussed above. Such positioning of the center of gravity provides aerodynamic stability and also simplifies flight control and design of such an aircraft. In case of an engine failure, these solar aircraft may remain airborne and can glide safely and controllably and land undamaged in designated areas, thus preventing potentially hazardous accidents and ensuring public safety and security. In some cases the whole or parts of a main wing and thus the whole aircraft can be foldable or collapsible, which may simplify transportation and assembly of the aircraft on the ground and its launching.

The size of a solar aircraft is determined by the demands of a specific application, in particular the weight of a payload and its power requirements. A larger weight of a plane requires a larger thrust from the propulsion system and thus more electrical power to maintain a level flight. The weight of a solar aircraft may vary from 0.5 kg to over 300 kg, requiring power to fly in the range from few watts to several kilowatts. Since most or all power on board of a solar aircraft is produced from sunlight, for a higher power payload a larger surface wing area populated with PV cells is needed. For example, an application that requires an average power consumption of 1 kW may need a solar UAV with at least 40 $m^2$ PV cell area, assuming 10% efficient PV cells. In this case, a solar wing may have a span of 20 m and an average chord of 2 m.

Various PV cells may be used in the solar aircraft described above, including mono-crystalline solar cells, polycrystalline and amorphous thin-film cells, organic solar cells, thermal PV cells and others. PV cell performance may be characterized and evaluated by different metrics, including its power conversion efficiency and specific power. The efficiency of a cell is the ratio of the energy converted to electricity to the amount of incident solar energy, whereas the specific power is the amount of converted electrical power per unit weight of a cell. In general, solar UAV applications favor PV technologies with higher efficiencies and higher specific power, which in turn lower aircraft weight and required wing surface area. In addition, for practical purposes it is also necessary to minimize solar cell's Cost per Watt of generated electricity, so that PV manufacturing costs have to be reasonably low.

Currently, the most efficient solar cells with efficiency in excess of 30% are based on epitaxially grown GaAs and related III-V semiconductors. The III-V solar cells are grown on relatively thick and heavy wafer substrates, resulting in a low specific power. In order to increase their specific power and make them suitable for UAV applications, the III-V solar cells can be lifted off their primary substrates and transferred to much lighter secondary substrates, such as for example polyimide substrates. If these cells can be made in large volumes at sufficiently low cost, they would be a suitable choice for solar UAVs. Alternatively, one can use thin film solar cells made on flexible lightweight substrates, such as those made from amorphous silicon, CdTe, $CuInGaSe_2$ (CIGS) and similar cells. Typical thin-film cells have efficiency of about 10%, the best performers being in the range of 10-15%. However, they are expected to improve in the future. These cells can be made on very light metal foils and plastic films at low cost. It is also possible to use very cheap organic solar cells, but such cells typically have lower efficiency of 5% or less, more susceptible to UV-induced degradation and thus less favorable for use on a solar aircraft. The main advantage of the III-V solar cell, namely their high efficiency, is due to their design: high-efficiency III-V cells are multi-junction cells, whereas most solar cells are single junction cells. The multi-junction cell design can be also implemented with thin film materials, based for example on CIGS-type compounds, and provide high-efficiency thin-film multi-junction solar cells. Such cells could potentially achieve efficiencies of about 30% approaching that of high-efficiency III-V solar cells, but at substantially lower cost and thus much more practical and attractive for UAV applications.

PV cells can be placed or integrated into any surface of a solar aircraft, particularly the top surface of its wings and other upward facing surfaces, which remains exposed to direct sunlight for almost the entire part of a day. The angled surfaces and particularly vertical or nearly vertical surfaces are attractive during periods when the sun is close to the horizon, e.g. at sunsets and sunrises or when flying in the polar regions. It also may be advantageous to place PV cells on the downward facing surfaces, such as the bottom surfaces of the wings, which may then collect reflected and scattered sunlight as well as thermal emissions from the Earth surface and clouds. Earth surface albedo may be in the range of 0.1-0.9, guaranteeing that downward facing solar PV cells may be able to collect at least 10% of additional solar energy. Also, thermal PV cells may be added and integrated into the downward facing wing surfaces to collect thermal emissions in the infrared spectral range from hot and warm surfaces below. PV cells may be laminated, glued, soldered or otherwise attached to these surfaces, or may be intimately integrated into the wing surface by becoming an integral part of an airframe and performing other functions, such as maintaining structural integrity, providing air lift, preventing icing, taking part in RF communication, and others. Alternatively, PV cells may be placed inside wings, provided at least some of its surfaces and the wing skin are transparent to sunlight. In this case, PV cells may be substantially detached from the wing surfaces and thus be better protected from the environment and free of mechanical stresses experienced by the wing skin during flight. Also in this case, bifacial PV cells may be used that are able to collect emissions from multiple directions, including direct sunlight from above the wing and scattered sunlight from below the wing.

A typical flexible, non-stretchable PV cell can conform to a curved surface following the surface of a bent plane, i.e., a surface with zero Gaussian curvature, such as that of either a cylinder or a cone. Therefore, it is preferable to design a solar wing that contains primarily surfaces having either generalized conical or cylindrical curvatures. For example, the bow wing 100 in FIG. 1 can be built from several straight sections 150, which in turn comprise only generalized cylindrical curvatures typical of a regular rectangular airfoil and thus allow straightforward integration of PV cells into the wing skin. Alternatively, a stretchable PV module may be used for integration into a solar wing as shown for example in the U.S. Pat. No. 7,923,282, in which case virtually any curvature, including non-zero Gaussian curvatures, may be used in the construction of such a solar wing. This approach may be suitable for example to use with the wing 200, where sections 250 are curved and comprise surfaces with generalized spherical type curvatures, i.e. those that have finite bending radii in two orthogonal planes at any given point.

PV cells may be arranged into groups, such as strings or arrays, which are interconnected with each other electrically in series and/or in parallel, providing common outputs to power management electronics, such as battery chargers, inverters, converters and others. Each group of PV cells may behave independently of all other groups, providing a set of DC (direct current) output voltages and currents that can be optimized independently and thus achieve maximum power conversion for any given operating condition, using MPPT (maximum power point tracking) devices. For example, PV cells or modules 160 on each wing section 150 in FIG. 1 may be organized in a PV group associated with that section, so that the wing 100 may comprise 12 independent PV groups. Each group of PV cells may be associated with a specific inverter, dedicated to optimization and conversion of DC power from a particular PV group to AC power and provide it to a common AC (alternating current) bus. The common bus operating at a preset regulated common voltage, in general, may be either an AC bus, a DC bus or a hybrid providing both AC and DC power to various components in the power train of an aircraft.

Figure 7:
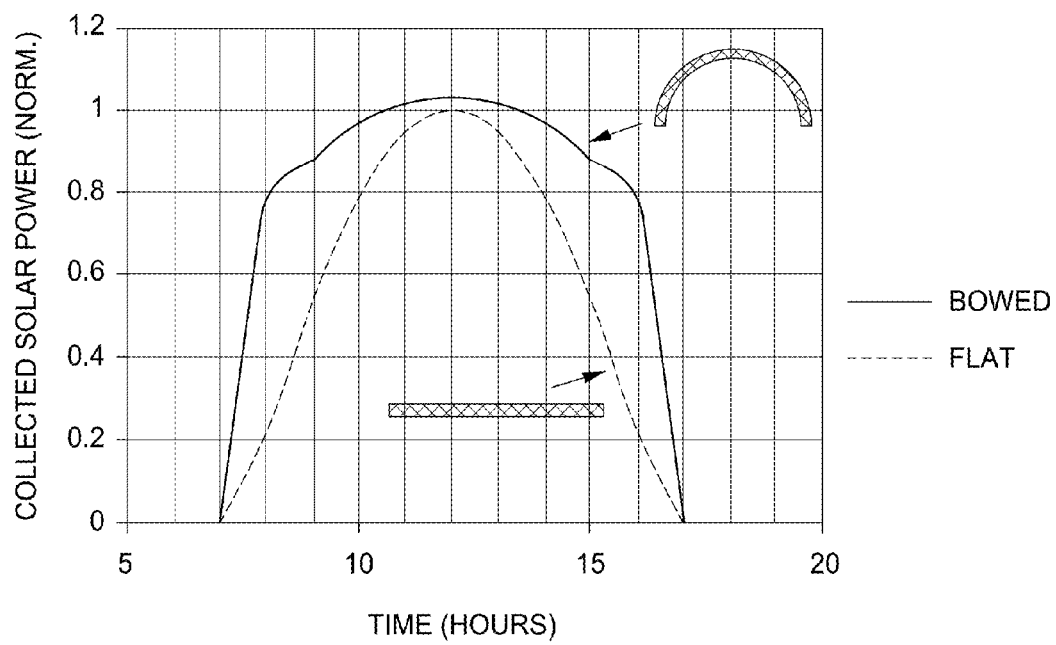
FIG. 7 shows comparison plots of solar power collected by a curved solar wing (solid line) and a flat solar wing (dashed line) for an aircraft flying at 20 km altitude, 40 degree latitude in the northern hemisphere during winter solstice.

HALE UAVs may experience a variety of illumination conditions when in flight, where the sunlight may come from different directions. A sunlight-powered unmanned aircraft may have one or more wings with straight or curved solar wings. When the sun is close to the horizon, a curved solar wing, such as the arched bow wing 100, may be able to collect more solar energy than a flat wing. Such operating conditions occur frequently, for example in early and late hours of the day close to sunrise and sunset or during most part of the day in regions at high latitudes. FIG. 7 shows comparison plots of solar power collected by a curved solar wing (solid line) and a flat solar wing (dashed line) for an aircraft flying at 20 km altitude, 40 latitude in the northern hemisphere during winter solstice. The curved solar wing has a cross-section of a semicircle. Both solar wings have the same length and thus the same weight. The horizontal axis corresponds to local time in hours, whereas the vertical axis corresponds to the normalized electrical power produced from sunlight by PV cells that are integrated into the wings. In this case the bow wing collects about 40% more total energy from the sun during the day than that the flat wing does. Importantly, the solar power supply from the bow wing is much more even over the course of day than that of a fixed flat wing. In general, it is always the case for a bow wing to be able to provide more solar power just after sunrise and before sunset. As a result, the onset of battery-powered flight for a solar aircraft with a bow wing can be delayed versus an aircraft with a flat wing. This feature is very attractive as well, as it may reduce operational demands on batteries and thus lead to a lower weight for batteries and the whole aircraft.

Figure 8:
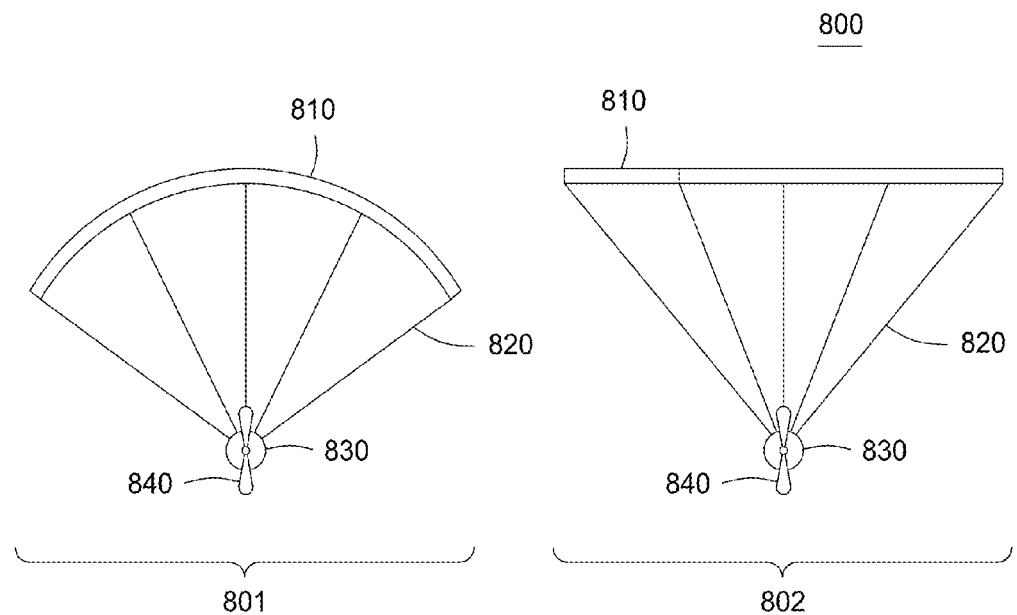
FIG. 8 depicts a flexible solar aircraft in accordance with some embodiments of the present invention that is able to take at least two different configurations.
Figure 9:
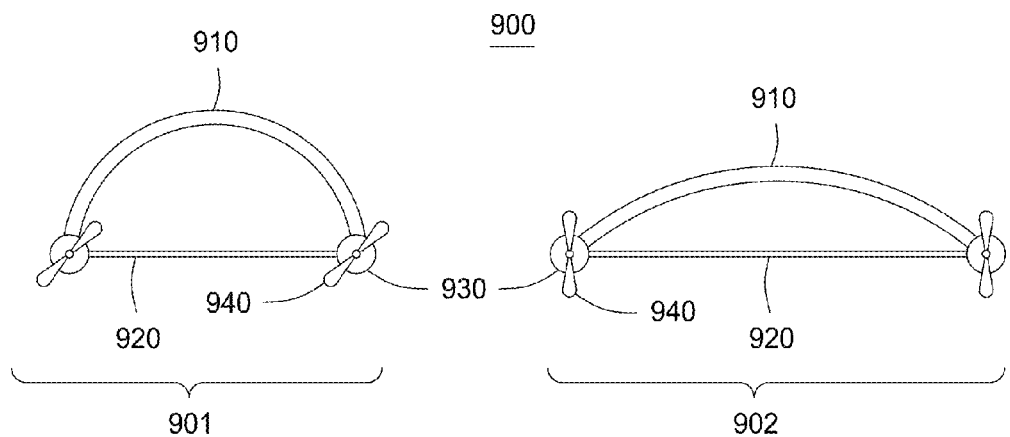
FIG. 9 depicts a shape-shifting solar aircraft in accordance with some embodiments of the present invention that can take at least two different shapes.

It is clear from the above discussion that high sun positions in the sky with small zenith angles favor the flat solar wing design, whereas the low sun positions in the sky with large zenith angles (i.e. closer to the horizon) favor the bow wing design. A flexible wing design can take advantage of both of these approaches. In this case a solar wing may be able to change its shape and morph into either flat or curved shapes. FIG. 8 shows a flexible solar aircraft 800 that is able to take at least two different configurations: a curved wing form 801 and a flat wing form 802. This aircraft may comprise at least one flexible wing 810, mobile struts 820, fuselage 830 containing engine, electronics, payload, etc. and attached propeller 840. The wing 810 can be flexed and bent without substantial changes in its cross-sectional shape and thus without dramatic changes in the aerodynamic lift force it provides. The wing shape change can be effected by the use of mobile struts 820, e.g. retraction of the edge struts inside the fuselage will cause the edges of the wing to fold forming an arch-shaped wing. FIG. 9 shows another shape-shifting solar aircraft 900 that can take at least two different shapes: shape 901 and shape 902. The aircraft 900 comprises at least one flexible solar wing 910, at least one mobile strut 920, at least one fuselage 930 (two are shown) and associated propellers 940. The wing 910 can be bowed to produce arched shapes with various radii of curvature, i.e., a flatter wing form 902 with a large radius of curvature or a curvier wing form 901 with a smaller radius of curvature. This shape-shifting can be realized with the help of a mobile strut 920, which when expands opens the wing 910 into a flatter form 902 and which when contracts bends the wing 910 into a more closed form 901. An actuator for the strut expansion and contraction can be located inside the fuselage 930. More specific requirements for wing shape changes can be produced for specific wing designs. Considering for example the triangular wing 1200, it is preferable to maintain it in a flat position, i.e. having the angle between sections 1210 and 1220 equal to zero, for the solar zenith angles of less than 60 degrees. However, at the solar zenith angles greater than 60 degrees, it is preferable to bow the wing in a triangular shape having one of its sections normal to the sun if possible, resulting in the angle between sections 1210 and 1220 equal to twice of the solar zenith. The wing bow can be increased until the maximum wing tip angle (the angle between the wing plane at the tip and the horizontal surface) is achieved when the bowed wing is no longer able to maintain a level flight at a constant altitude. The specific wing-shape changes that optimize solar energy collection and maximum wing tip angles generally depend on the specific wing design.

Both fixed and flexible wing designs may benefit for arranging PV cells into independently controlled PV groups or arrays. Different parts of a solar wing or other cell-carrying surfaces may be subjected to different amounts of solar irradiation leading to production of different powers and correspondingly different sets of currents and voltages in PV cells associated with these surfaces. In this case it is preferable to at least interconnect these PV cells using diode protection against reverse current in order to prevent electrical shorting and breakdown of insufficiently illuminated cells. For example, several PV cells may be electrically connected in series, whereas the reversed diodes are connected in parallel to at least some of these PV cells. This arrangement may be attractive for downward facing PV cells (e.g. those on the bottom surface of a wing) that collect primarily scattered light or thermal emissions from the Earth surface or atmosphere. However, in general such cell interconnection does not provide the best possible energy yield and results in a lower PV system efficiency. Instead of or in addition to diode protection, PV cells may be electrically connected into separate groups, so that the amount of solar radiation throughout the day fallen on an individual PV cell remains nearly identical or closely matched between different cells within each group. Thus, PV cells within each group may be either current matched, voltage matched, or both; for example, PV cells within a group may be connected in series to produce a PV string. This arrangement may be attractive for example for interconnection of PV cells on the top surface of a bowed wing. PV cells in different groups in this case are not directly interconnected with each other. Instead, the electrical output of each PV group may be converted into a different form (e.g. using DC to AC conversion) and provided to a common electrical bus in the power train. Output power from a PV group may vary dramatically during the day and even shorter time scales depending on the orientation of an aircraft with respect to the sun. Thus, power conversion electronics may be able to react to these changes and optimize energy collection on time scales from several hours to less than a second. Also, in such a PV system at any given moment some PV groups may contribute a maximum possible power output, other groups may contribute zero power (when they are completely shaded from the sun), while the rest may operate anywhere in between these two extreme conditions. One or more power system controllers may control and synchronize operation of power conversion devices in each group. Their operation in general should be matched to the instantaneous electrical load on the common bus, which has contributions from an electrical motor drive, a battery charger, flight control electronics, communication electronics, payloads and other potential electrical components in an aircraft.

In some embodiments, a method of constructing a long endurance unmanned solar aircraft, such as any of the above, is provided. For example, in some embodiments, a method of constructing a long endurance unmanned solar aircraft may include providing a solar wing having a downward bow shape and at least one photovoltaic cell, and providing a fuselage containing an electric motor, battery, power electronics, flight controls, and communications. The fuselage may be placed and attached below the solar wing using one or more of direct attachment or attachment via an additional strut.

The at least one photovoltaic cell may comprise a plurality of photovoltaic cells, and method may further include arranging the plurality of photovoltaic cells into plurality of photovoltaic groups and providing a separate power conversion device for each photovoltaic group.

In some embodiments, the at least one photovoltaic cell may be positioned face up to collect direct sunlight. In some embodiments, the at least one photovoltaic cell may be positioned face down to collect scattered sunlight.

In some embodiments, the method may further include connecting the photovoltaic groups to a common electrical bus, and connecting the common electrical bus to one or more electrical loads comprising at least electrical storage and an electric motor such that electrical power from the photovoltaic groups may be distributed to the one or more electrical loads via the common electrical bus.

In some embodiments, the solar wing has the ability to straighten and the method may further include providing actuators operable to straighten and bend the solar wing to a desired shape.

While the foregoing is directed to embodiments of the present invention, other and further embodiments of the invention may be devised without departing from the basic scope thereof.

The invention claimed is:

1. An unmanned solar-powered aircraft, comprising:
   a lightweight solar wing comprising an airfoil profile, a top surface, a bottom surface, a leading edge, a trailing edge, wing tips, and at least one photovoltaic cell, wherein the surfaces and edges follow a negative downward curvature bow shape across a span of the wing during flight, and wherein the wing weight to surface area ratio is less than 5 kg/m$^2$;
   a fuselage, and
   a propeller, wherein the fuselage is placed below the solar wing and contains an electric motor, a battery, and electronics.

2. The aircraft of claim 1, wherein the top surface of the solar wing has zero Gaussian curvature.

3. The aircraft of claim 1, wherein the solar wing is asymmetric with respect to any vertical symmetry plane.

4. The aircraft of claim 1, wherein the airfoil profile of the solar wing is constant across the span of the wing.

5. The aircraft of claim 1, wherein the at least one photovoltaic cell is attached to at least one part of the top surface, bottom surface, leading edge, or trailing edge.

6. The aircraft of claim 1, wherein the at least one photovoltaic cell is placed inside a volume of the solar wing, which boundaries are defined by the surfaces and edges, wherein at least one of the surfaces is optically transparent.

7. The aircraft of claim 1, wherein the at least one photovoltaic cell comprises a plurality of photovoltaic cells that are segregated into a plurality of groups, wherein each of the photovoltaic cells within a given group are electrically connected to each other.

8. The aircraft of claim 1, wherein the bow shape of the solar wing is one of semi-circular, semi-elliptical, or polygonal arch shapes.

9. The aircraft of claim 1, wherein the solar wing further comprises a structural strengthening element having the bow shape and the ability to maintain the bow shape in flight.

10. The aircraft of claim 1, wherein the bow shape of the solar wing is changeable by varying its radius of curvature.

11. The aircraft of claim 1, wherein the at least one photovoltaic cell is at least one of: disposed on a flexible substrate, comprises at least one stretchable photovoltaic cell, or comprises at least one thin-film multi-junction solar cell.

12. The aircraft of claim 1, further comprising at least one strut used to tighten the solar wing and maintain its shape, wherein the at least one strut has two ends that are attached to respective wing tips of the solar wing.

13. The aircraft of claim 1, wherein the fuselage is positioned so that the aircraft has a center of gravity that is substantially below the solar wing when in flight.

14. The aircraft of claim 1, wherein the fuselage is positioned so that the aircraft has a center of gravity that is in front of a neutral point of the solar wing when in flight.

15. The aircraft of claim 1, wherein the fuselage is directly attached to the solar wing.

16. The aircraft of claim 1, further comprising a tail section for flight control.

17. The aircraft of claim 1, wherein the fuselage is shaped as a wing.

18. The aircraft of claim 1, wherein the fuselage comprises a plurality of fuselages and the propeller comprises a plurality of propellers.

19. The aircraft of claim 1, further comprising at least one actuator to effect changes in the shape of the solar wing.

20. The aircraft of claim 1, wherein the airfoil profile of the solar wing comprises a plurality of airfoil profiles that vary across the span of the wing.

21. The aircraft of claim 20, wherein the airfoil profile variation is non-monotonic.

22. The aircraft of claim 1, wherein the solar wing further comprises a plurality of sections, each section having a top surface, a bottom surface, a leading edge, and a trailing edge.

23. The aircraft of claim 22, wherein each section in the plurality of sections is a straight section.

24. The aircraft of claim 22, wherein the bow shape is changeable by varying angles between the solar wing sections.

25. The aircraft of claim 1, further comprising at least one strut used to attach the fuselage to the solar wing.

26. The aircraft of claim 25, wherein the at least one strut is operable to change its length and thereby vary the shape of the solar wing.

27. The aircraft of claim 1, wherein the at least one photovoltaic cell comprises a plurality of photovoltaic cells arranged in a plurality of photovoltaic groups and further comprising a plurality of power conversion devices respectively associated with each photovoltaic group.

28. The aircraft of claim 27, further comprising a common electrical bus, wherein the common electrical bus is connected to the plurality of power conversion devices.

* * * * *